United States Patent [19]

LeVert

[11] 4,316,180

[45] Feb. 16, 1982

[54] DIRECTIONAL DETECTOR OF CHANGES IN A LOCAL ELECTROSTATIC FIELD

[76] Inventor: Francis E. LeVert, 7233 S. Luella, Chicago, Ill. 60649

[21] Appl. No.: 28,247

[22] Filed: Apr. 9, 1979

[51] Int. Cl.[3] ...................... G08B 13/26; G01R 29/12

[52] U.S. Cl. .................................... 340/562; 307/116; 310/309; 324/457; 336/84 R; 343/824; 343/894

[58] Field of Search ........................ 340/561, 562, 565; 343/742, 847, 848, 824, 841, 894; 324/457, 458, 260, 452; 310/309; 336/84 R, 69; 361/233; 307/116, 125

[56] References Cited

U.S. PATENT DOCUMENTS

| | | | |
|---|---|---|---|
| 3,510,677 | 5/1970 | Lister | 340/562 X |
| 3,551,919 | 1/1971 | Forbes | 340/562 X |
| 4,007,418 | 2/1977 | Hanna | 340/562 X |
| 4,031,408 | 6/1977 | Holz | 307/116 |

*Primary Examiner*—John W. Caldwell, Sr.
*Assistant Examiner*—Joseph E. Nowicki

[57] ABSTRACT

A directional detector of changes in a local electrostatic field comprising two parallel flat coils of copper wire, separated by an electrically grounded plane rectangular conductor that is coated on both sides with an insulator, and associated signal conditioning electronics has been constructed. The combination of coils and plane rectangular conductors forms two independent wideband antennas which, when placed in an unobstructed electromagnetic radiation field, have induced in them electric currents of equal peak-to-peak values. When the combination was brought near an ungrounded body, such as a person standing on an insulator to earth, a coupling of high frequency potentials of the ungrounded body and the nearest coil occurred, while the coil farthest away from the body, due to the presence of the electrically grounded plane rectangular conductor, was unaffected. The coupling of high frequency potentials caused an increase in the amplitude of the electric current in the affected coil which was used in conjunction with the electric current in the unaffected coil, and the signal conditioning electronics to activate an alarm unit.

1 Claim, 4 Drawing Figures

DIRECTIONAL DETECTOR OF CHANGES IN A LOCAL ELECTROSTATIC FIELD

BACKGROUND OF THE INVENTION

This invention relates to the detection of potential intruders before damage is done to personal property. To prevent the loss of personal property from ones home or apartment it is necessary to employ devices to signal an attempt at entry or the entry of an intruder. The most widely used alarm systems employ conducting strips/wires or contactors that must be broken or disengaged to cause the initiation of an alarm signal. These systems, while efficient, have the disadvantage of requiring property damage or physical intrusion before an alarm signal is produced by an enunciator. A different class of home and apartment security devices which are less widely deployed make use of more sophisticated systems in which transmitters and receivers or motion and noise sensors are employed to sense the presence of an intruder without the event of property damage. But the instrumentation is, in most cases, complex and expensive.

It would be useful to have an alternate low cost means of detecting the presence of a potential intruder before entry into or damage to private property has occurred. It would be particularly useful to have a potential intruder detector that does not require the sophistication associated with coupled transmitters and receivers.

It is an object of the present invention to provide a directional sensitive detector of electrostatic field disturbances for placement in or near entry and exit points of a home or apartment.

Other objects will become apparent in the course of a detailed description the invention.

SUMMARY OF THE INVENTION

A directional detector of disturbances in a local electrostatic field comprises two flat copper wire coils separated by an electrically grounded plane rectangular conductor with electrical insulator on both of its sides. The copper coils, hence referred to as coil antennas, act an antennas in which the ambient electromagnetic radiation induces a significant alternating current(a.c.). The electrically grounded plane rectangular conductor acts to electrically decouple the two coil antennas. This combination of flat coil antennas can be electrically connected to an electronic circuit which is used to activate an alarm unit. Measurements performed using an oscilloscope revealed that changes in the electrostatic field of either of the coil antennas causes an instantaneous in the amplitudes of the a.c. current flowing in the antennas. An electronic circuit can be used to sense this amplitude change and produce a trigger voltage. This trigger voltage can be used to turn on an electrical component which permits the flow of electric current in a circuit containing an enunciator.

The detector which responds to frequencies up to several megahertz contains two coil antennas such that one can be used as a compensating current source for nulling out ambient electromagnetic radiation effects thereby making the device independent of variations in electromagnetic field intensities at different positions or locations.

DETAILED DESCRIPTION OF THE INVENTION

Figure 1:
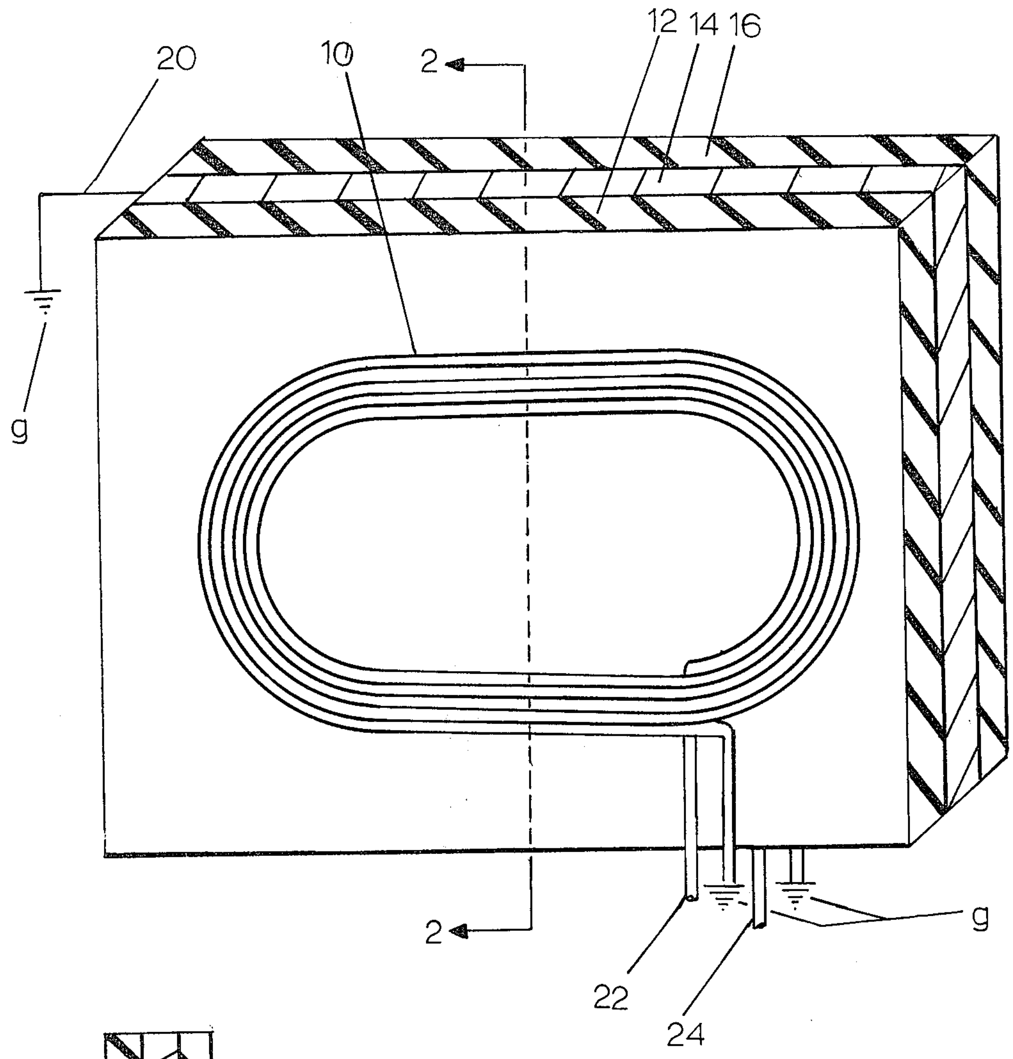
FIG. 1 is a side view of the electrostatic field disturbance detector of the present invention.
Figure 2:
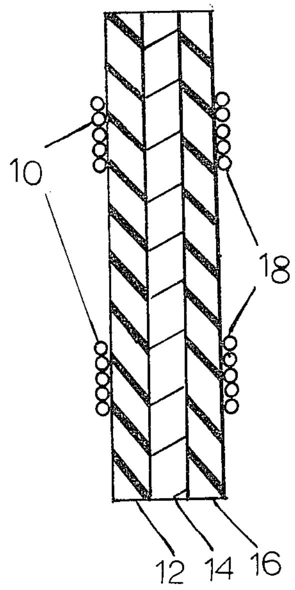
FIG. 2 is a cross sectional view of the detector of FIG. 1 taken along section lines 2—2.

FIG. 1 is a side view of the electrostatic field disturbance detector and FIG. 2 is a cross sectional view of the detector along section lines 2—2 of FIG. 1. In FIGS. 1 and 2, flat coil antennas 10 and 18 are formed with 10 mil diameter copper wire with 20 turns each. Coil antennas 10 and 18 are shown as oval shaped plane coil antennas because plane oval antennas, with coated 10 mil wire, were readily available. This shape and wire size, however, is arbitrary. Antennas 10 and 18 could equally as well be circular coils, small wire wound cylindrical ferrite cores or any other shape or antenna type such that electrical energy absorbed from passing electromagnetic waves would yield a detectable signal. Coil antennas 10 and 18 are electrically separated by insulator 12 and 16 are 10 mil Mylar. Plane rectangular copper foil 14 which is electrically grounded (the electrical ground is hence referred to by the symbol 'g' in the FIGS. 1, 2, and 3) as by lead 20, serves to prevent effects of capacitive coupling or other disturbances in the electrostatic field near the front side of one of the antennas from significantly influencing the signal in the adjacent antenna. Thereby it behaves as an electrical and magnetic field shield. The phrase "front side" when used in reference to one of the antennas is meant to refer to the side of the antenna facing away from an insulator-antenna interface.

Figure 3:
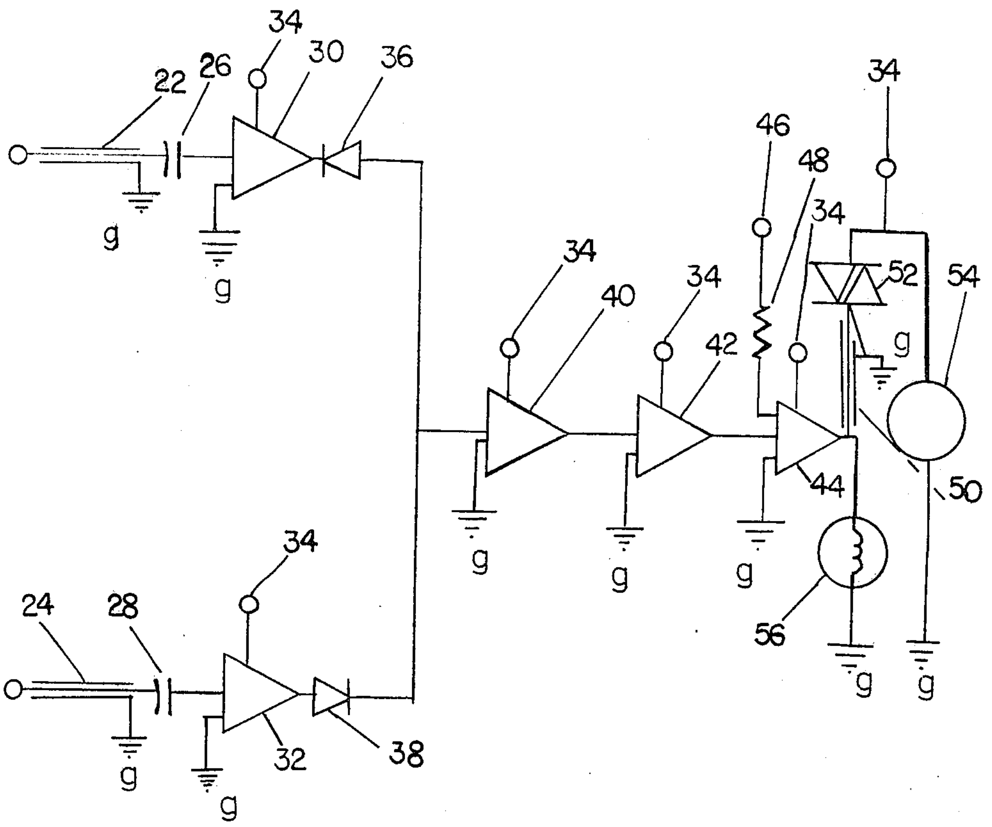
FIG. 3 is a schematic diagram of a typical circuit of signal conditioning electronics and an enunciator circuit.
Figure 4:
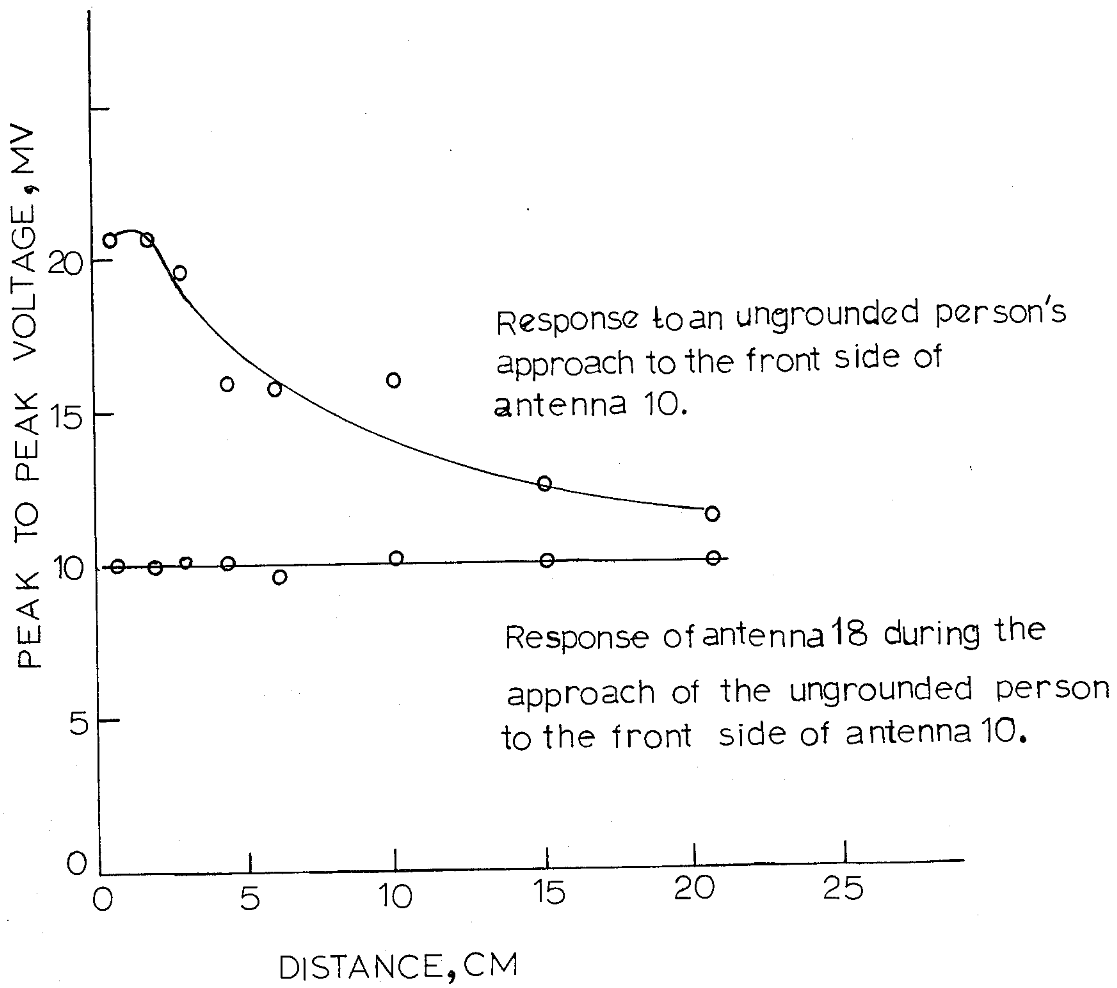
FIG. 4 is a plot of the peak-topeak a.c. voltage output of each coil antenna in the detector unit observed via an oscilloscope as a person approached the detector along a path perpendicular to the plane of one of the coil antennas.

A typical circuit for processing the electrical signals from antennas 10 and 18 is represented in FIG. 3. In FIG. 3, coaxial cables 22 and 24 are electrically connect antennas 10 and 18 to capacitors 26 and 28. Capacitors 26 and 28 block the flow of direct current from antennas 10 and 18 to wideband amplifiers 30 and 32, respectively, hence referred to as WBA 30 and WBA 32. WBA 30 and WBA 32 are electrically powered by voltage supply 34. The input a.c. current to WBA 30 and WBA 32 are amplified from peak-to-peak values of a few millivolts up to peak-to-peak values greater than one volt. WBA 30 and WBA 32 are equipped with manual gain controls such that their output currents can be equalized thereby making it possible to use one or the other as a compensating current. Diodes 36 and 38 are electrically connected to WBA 30 and WBA 32, respectively. Diodes 36 and 38 are used to rectify the a.c. outputs of WBA 30 and WBA 32. Diodes 36 and 38 are electrically connected to ordinary summing amplifier 40 which amplifies the algebraic difference of the two signals. Integrator 42 whose input and output are electrically connected to summing amplifier 40 and to comparator 44, respectively, integrates the output of summing amplifier 40. When the output of integrator 42 is connected to comparator 44 negative input terminal, comparator 44 produces an output voltage only under the condition where the output of integrator 42 is positive and of magnitude greater than or equal reference voltage 46 which is electrically connected to the positive input of comparator 44. Positive direct current reference voltage 46 is obtained by electrically connecting resistor 48 to the positive input of comparator 44 and to voltage supply 34. The output of comparator 44 is connected to triac 52 as by lead 50. Triac 52 is normally in the off state during which time it prevents the flow of electric current from supply voltage 32 through enunciator 54. When triac 52 is triggered by a voltage signal from comparator 44 a bias is impressed across the enunciator. Lamp 56, which is electrically connected between the output of comparator 44 and the established electrical ground, is used to indicate the on and off (conducting and nonconducting) states of comparator 42.

Operation of the invention of FIG. 1 and 2 in conjuction with the signal conditioning circuit of FIG. 3 will now be explained. Under normal conditions the outputs of antennas 10 and 18 are amplified by WBA 30 and WBA 32 and clipped by diodes 36 and 38, respectively, so as to cause the output of summing amplifier 40 to be near zero in magnitude. If, however, a potential intruder approaches the front side of antenna 10 to within a certain radius the amplitude of the induced signal from the ambient electromagnetic radiation is increased by up to 100%. This results from capacitive coupling between the potential intruder and antenna 10. This signal is amplified by WBA 30 and rectified by diode36 while the output of WBA 32 and consequently the rectified signal from diode 38 remains unchanged. Since the rectified signal from diode 36 is positive while that from diode 38 is negative the output of summing amplifier 40 becomes large and positive. The output of the summing amplifier 40 is integrated by integrator 42. The time constant of integrator 42 is choosen so as to require a minimum resident time for a source of disturbance in the electrostatic field before its output becomes large enough to trigger comparator 44 whose triggering level is set by reference voltage 46. The triggering of comparator 44 results in the triggering of triac 50. Triac 50, when it is in the on state, causes a bias to be placed across the enunciator 54 thereby initiating an alarm. In the above explanation, antenna 18 serves as a compensating current source and makes the detector independent of natural variations in electromagnetic radiation insitensity in a given geographical region. The signal conditioning circuit prevents the occurrence of false alarms due to changee in the electrostatic field of antenna 18. While the detector and the associated electronics are designed to trigger on disturbances setup in antenna 10, the system could equally as well be designed to respond to disturbances setup in antenna 18 with antenna 10 serving as the compensating current source.

The embodiment of the invention in which an exclusive property or privilege is claimed are defined as follows:

1. A detector of disturbances in an electrostatic field comprising:

a first flat coil antenna with two terminal points;

a first plane sheet of electrical insulator disposed parallel to the flat coil antenna and bonded thereto in physical contact therewith;

a plane sheet of electrical conductor disposed parallel to the first plane sheet of insulator material and bonded thereto in physical contact therewith;

a second plane sheet of electrical insulator material disposed parallel to the plane sheet of electrical conductor and bonded thereto in physical contact therewith;

a second flat coil antenna with two terminal points disposed parallel to the second plane sheet of electrical insulator material and bonded thereto in physical contact therewith;

means of electrically connecting the plane sheet of electrical conductor to an electrical ground thereby electrostatically decoupling the two parallel flat coil antennas;

means of completing an electrical circuit between one terminal point of each of the flat coil antennas and two separate electrical input channels of a typical signal conditioning circuit and for completing a electrical connection between the remaining terminal points of both antennas to an electrical ground;

means of, within the signal conditioning circuit of, using the induced electrical current in either of the flat coil antennas as a reference current source; and means of electrically connecting the output of a typical conditioning circuit to an ordinary enunciator unit.

* * * * *